US 6,576,178 B2
Jun. 10, 2003

(54) RESIN SEALING APPARATUS AND RESIN SEALING METHOD

(75) Inventors: Hideki Mizuno, Tokyo (JP); Kiyomitsu Ishimura, Tokyo (JP)

(73) Assignee: NEC Compound Semiconductor Devices, Ltd., Tokyo (JP)

( * ) Notice: Subject to any disclaimer, the term of this patent is extended or adjusted under 35 U.S.C. 154(b) by 223 days.

(21) Appl. No.: 09/740,956

(22) Filed: Dec. 21, 2000

(65) Prior Publication Data

US 2001/0004923 A1 Jun. 28, 2001

(30) Foreign Application Priority Data

Dec. 22, 1999 (JP) ............................................. 11-364148

(51) Int. Cl.[7] ........................... B29C 45/14; B29C 70/70
(52) U.S. Cl. ............................. 264/272.14; 264/272.15; 264/272.17; 425/110; 425/117
(58) Field of Search ..................... 438/127; 264/272.14, 264/272.17, 255, 254, 263, 251, 272.15, 276; 425/110, 117, 120, 130

(56) References Cited

U.S. PATENT DOCUMENTS

| | | | | |
|---|---|---|---|---|
| 5,232,651 A | * | 8/1993 | Okuno et al. ............... 264/123 |
| 5,476,039 A | * | 12/1995 | Hiruta et al. ............... 101/123 |
| 5,704,286 A | * | 1/1998 | Takashima ................... 101/123 |
| 5,744,171 A | * | 4/1998 | Schneider ................... 118/213 |
| 5,989,474 A | * | 11/1999 | Suzuki ........................ 264/139 |
| 6,015,520 A | * | 1/2000 | Appelt et al. ................ 264/104 |
| 6,019,932 A | * | 2/2000 | Kambara .................... 264/102 |
| 6,149,857 A | * | 11/2000 | McArdle et al. .......... 156/272.4 |
| 6,264,862 B1 | * | 7/2001 | Liaw ........................... 264/102 |
| 6,319,851 B1 | * | 11/2001 | Mihara et al. .............. 118/255 |
| 2001/0012643 A1 | * | 8/2001 | Asada ......................... 438/107 |
| 2001/0047587 A1 | * | 12/2001 | Kotaki ......................... 29/843 |

FOREIGN PATENT DOCUMENTS

| | | |
|---|---|---|
| JP | 56-17129 | 7/1954 |
| JP | 61-270159 A | 11/1986 |
| JP | 2-251153 | 10/1990 |
| JP | 5-110250 A | 4/1993 |
| JP | 7-128245 A | 5/1995 |
| JP | 7-164614 | 6/1995 |
| JP | 9-216338 A | 8/1997 |
| JP | 10-217188 A | 8/1998 |
| JP | 11-251341 | 9/1999 |

* cited by examiner

*Primary Examiner*—Angela Ortiz
(74) *Attorney, Agent, or Firm*—Sughrue Mion, PLLC

(57) ABSTRACT

An apparatus for sealing a resin uses a liquid resin. A substrate has a frame for surrounding the substrate and is provided with a plurality of semiconductor devices. The substrate has a first opening portion. A squeegee guide plate is placed on the frame and has a second opening portion. The second opening portion is larger than first opening portion in size. A first squeegee moves along the squeegee guide plate in a first direction and rakes the liquid resin. The liquid resin is protuberated in order to bury the semiconductor devices. A second squeegee moves along the squeegee guide plate in a second direction opposite to the first direction and further rakes the liquid resin so as to smooth a surface of the liquid resin. A turning mechanism serves to turn the second squeegee in a circular arc form during the movement of the second squeegee.

5 Claims, 6 Drawing Sheets

RESIN SEALING APPARATUS AND RESIN SEALING METHOD

BACKGROUND OF THE INVENTION

This invention relates to an apparatus for resin-sealing a plurality of semiconductor devices, and a resin sealing method thereof.

In the conventional semiconductor apparatus of a resin-sealing type package, semiconductor devices are arranged on a read-frame, and are resin-sealed by the use of the known transfer mold method.

However, when a plurality of semiconductor devices arranged on a large wiring substrate are resin-sealed, a molding die will be required. This die is generally expensive in cost. Further, the resin-sealed package can not be thinned.

Even when the die is thinly produced, a warp or a crack takes place for the package. Further, the semiconductor device floats in a cavity by a resin injection pressure. As a result, the semiconductor device is obliquely resin-sealed. Moreover, a wiring pattern will be exposed from the package.

To solve these problems, suggestions have been made about a resin-sealing method by filling resin by the known potting method or screen printing method.

With respect to these methods, disclosure has been made about the resin-sealing method due to the screen printing method in Japanese Unexamined Patent Publication (JP-A) No. Hei. 2-251153 and Japanese Unexamined Patent Publication (JP-A) No. Hei. 11-251341.

In these methods, a single semiconductor device arranged on a film is resin-sealed. More specifically, the semiconductor device is arranged on the film fixed at the periphery thereof.

In this condition, the semiconductor device is covered with a metal mask. Further, a liquid resin is dropped for the metal mask.

In this event, a squeegee is traveled or moved on the metal mask, and the liquid resin is fallen down or dropped from the window of the metal mask.

Thereby, the liquid resin is filled in a space portion including the semiconductor device under the window of the metal mask.

Under such a circumstance, a trial has been made as follows.

Specifically, the flame is attached to the periphery of the wiring substrate, and the metal mask having a large number of small holes is arranged on the frame.

Further, the liquid resin is dropped onto the mask, and the squeegee is traveled on the mask. Moreover, the liquid resin is dropped from the holes, and the liquid resin is filled in the frame.

As a result, although a resin surface which is relatively thin can be obtained, a filling volume is large as compared with the semiconductor device arranged on the above-mentioned film, and a filling time also becomes long.

Referring to FIGS. 1A and 1B, description will be made about the conventional resin-sealing method by the use of the liquid resin so as to solve the above-mentioned problems.

A plurality of semiconductor devices 24 are arranged on a substrate 21 having a frame. The substrate 21 is provided on a stand 22, as illustrated in FIG. 1A.

With this structure, the mask (not shown) having a slightly larger opening portion than the opening portion of the substrate 21 is placed on the substrate 21, so that the opening portion of the frame is exposed.

In this condition, the liquid resin 23 is filled at a higher position than an upper surface inside the frame, and the squeegee (not shown) is traveled with a constant tilt angle on a mask plate (not shown) positioned over the frame.

As a result, the surface of the liquid resin 23 filled inside the frame is recessed or depressed in a part of the opening portion where the squeegee is initially traveled.

On the other hand, the edge of the opening portion, where the travel of the squeegee is completed, is protuberated.

As described above, when the liquid resin 23 is depressed or protuberated from the frame surface, it is unsuitable to provide a chip as the semiconductor device 24 under these portions. This is because the semiconductor or the wiring portion is exposed.

In the meantime, the protuberated portion must be removed, and as a result, unnecessary steps are also required.

Alternatively, the semiconductor device 24 may be arranged in the central portion of the substrate 21 having the frame by enlarging the substrate considering the recess or the protuberance.

However, the large substrate can not achieve the reduction in size, and inevitably consumes a large quantity of resin liquid. Consequently, this alternative method is also unsuitable.

SUMMARY OF THE INVENTION

It is therefore an object of this invention to provide a resin-sealing apparatus capable of rapidly sealing resin so as to smooth a resin surface by using a liquid resin.

According to this invention, an apparatus for sealing a resin uses a liquid resin.

A substrate has a frame for surrounding the substrate and is provided with a plurality of semiconductor devices. Herein, the substrate has a first opening portion.

A squeegee guide plate is placed on the frame and has a second opening portion. In this event, the second opening portion is larger than first opening portion in size.

A first squeegee moves along the squeegee guide plate in a first direction, and rakes the liquid resin. In this case, the liquid resin is protuberated in order to bury the semiconductor devices.

A second squeegee moves along the squeegee guide plate in a second direction opposite to the first direction, and further rakes the liquid resin so as to smooth a surface of the liquid resin.

A turning mechanism serves to turn the second squeegee in a circular arc form when the second squeegee is moving.

In this case, the turning mechanism preferably includes a squeegee head, a pair of fixing members, a linking member, a circular arc gear, and a motor.

Specifically, the squeegee head is attached to the first squeegee, and has guide grooves of a circular arc form having a pair of coaxial circles.

The fixing members slide along the guide grooves, and fix the second squeegee. The linking member links the fixing members to each other.

The circular arc gear is fixed to the fixing members. The motor rotates the gear.

The apparatus further includes a supporting portion which supports the first and second squeegees, and an up-down transferring mechanism which transfers the supporting portion upward and downward.

The apparatus further comprises an air cylinder which transfers the first squeegee forward and backward.

The apparatus further includes an angle-adjusting board which adjusts a slope of the first squeegee.

With such a structure, the first squeegee moves in the first direction along the squeegee guide plate.

The liquid resin is dropped into the frame of the substrate so as to protuberate over the semiconductor devices. The protuberated liquid resin is raked.

The second squeegee moves in the second direction along the squeegee guide plate. The liquid resin is raked again, so that a tilt angle between a liquid resin surface and the second squeegee is gradually increased by the use of the turning mechanism.

DESCRIPTION OF PREFERRED EMBODIMENT

Figure 1A:
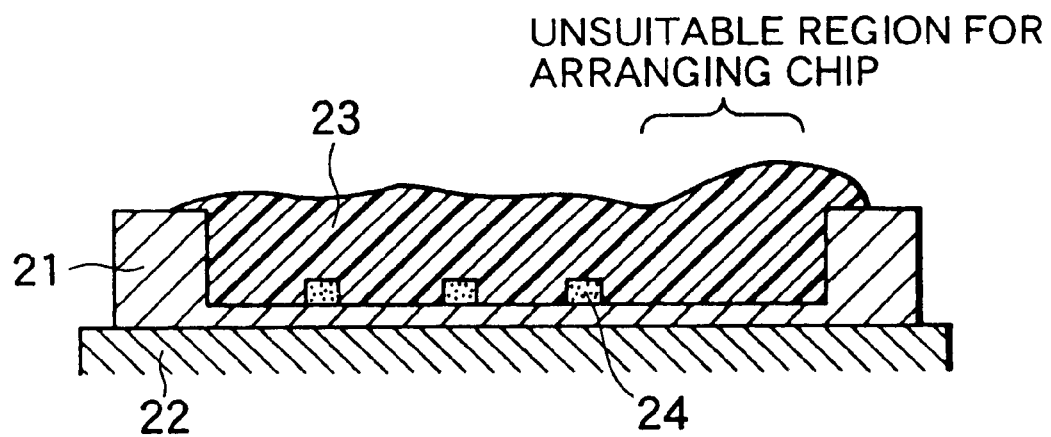
FIGS. 1A and 1B are cross sectional views showing the conventional resin-sealing method using a liquid resin.
Figure 1B:
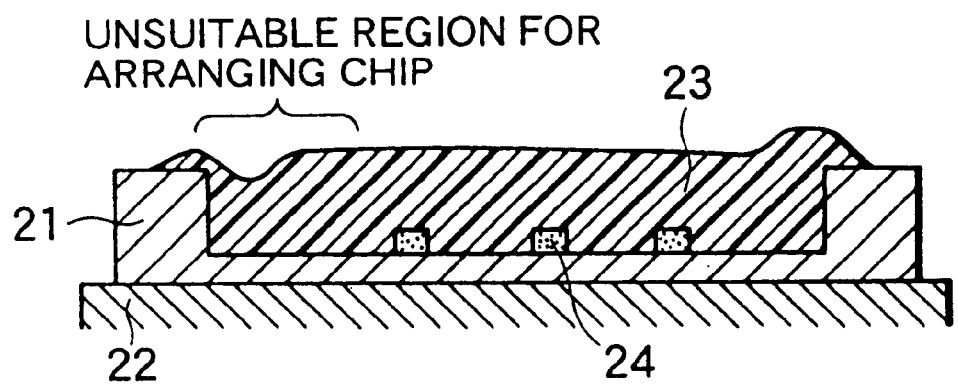
Figure 2:
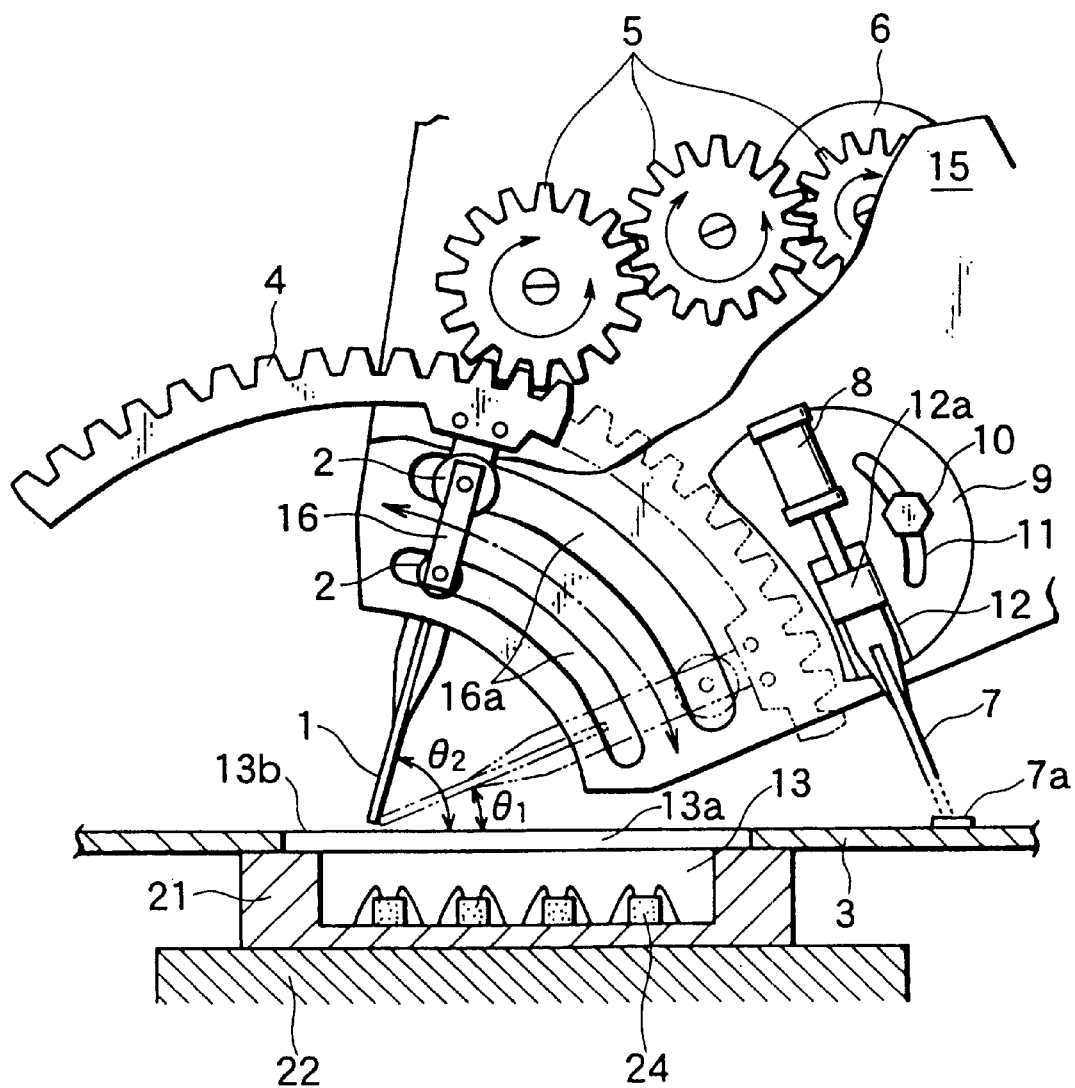
FIG. 2 is a side view showing a resin-sealing apparatus according to an embodiment of this invention.

Referring to FIGS. 1 and 2, description will be made about a resin-sealing apparatus according to an embodiment of this invention.

In the resin-sealing apparatus illustrated in FIGS. 1 and 2, a substrate 21 having a frame is placed on a stand 22. On the substrate 21, a plurality of semiconductor devices 24 are arranged. The substrate 21 has an opening portion 13.

A squeegee guide plate 3 is provided on the substrate 21. Herein, the squeegee guide plate 3 has an opening portion 13a which is slightly larger than the opening portion 13.

A first squeegee 7 moves or travels on the squeegee guide plate 3 in a first direction with a desired slope. On the other hand, a second squeegee 1 moves or travels on the squeegee guide plate 3 in a second direction opposite to the first direction.

A turning mechanism having a circular arc gear 4 turns the second squeegee 1 to a circular arc form during the travel of the second squeegee 1.

The turning mechanism can steplessly change the tilt angle of the second squeegee 1 from θ1 to θ2. The turning mechanism slides along guide grooves 16a having circular ark-two coaxial circles at both squeegee supporting portion 15.

Further, the turning mechanism is provided with a pair of fixing members 2 for fixing the second squeegee 1, a linking plate 16 for linking the fixing members 2, a circular arc gear 4 linked and fixed to the fixing member 2, and a motor 6 for rotating the circular arc gear 4 via gears 5.

As illustrated in FIG. 2, the first squeegee 7 positioned in the squeegee supporting portions 15 is fixed to a block 12a.

Herein, the block 12a slides along a guide 12 of an angle-adjusting board 9 attached to the squeegee-supporting portion 15 so as to rotate.

Further, the block 12a is attached to a piston end of an air cylinder 8. A tip portion of the first squeegee 7 moves or travels between a retreated position and a predetermined position via the air cylinder 8.

Further, the slope of the first squeegee 7 can be selected as desired by loosening a lockbolt 10 and by sliding and rotating the angle-adjusting board 9 along a long hole 11.

Figure 3:
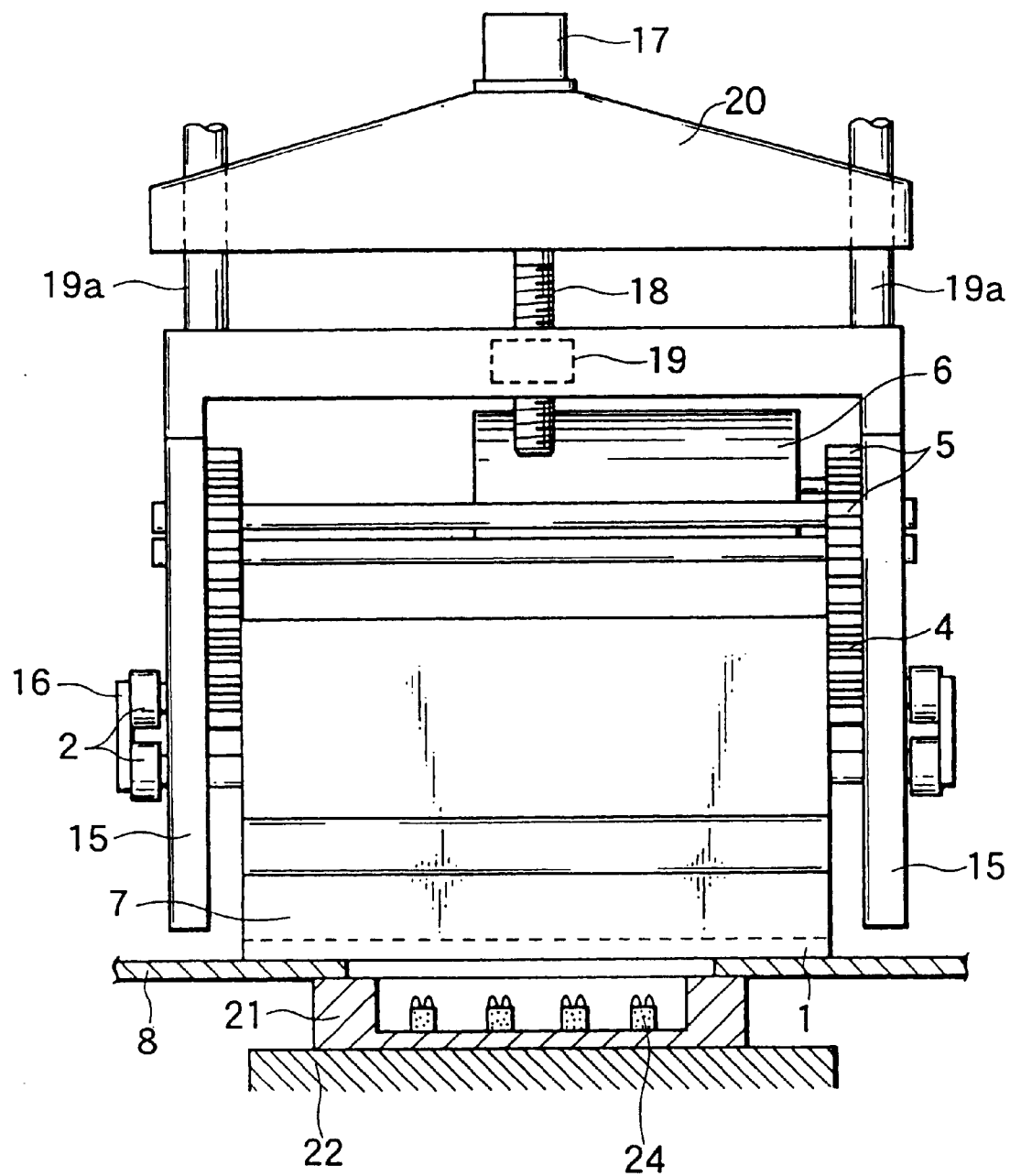
FIG. 3 is a plan view showing a resin-sealing apparatus according to an embodiment of this invention.

As illustrated in FIG. 3, a pulse motor 17 is provided with a squeegee head 20 attached to a column (not shown). Further, there is provided with a feeding screw 18 which rotates by a pulse motor 17, a nat 19 which engages with the feeding screw 18, and a guide bar 19a which guides the squeegee supporting portion 15.

In this case, the first squeegee 7 and the second squeegee 1 for raking or smoothing the liquid resin is desirably produced by polytetrafluoroethlene (called Teflon) such that the resin is not attached thereto.

Alternatively, the first squeegee 7 and the second squeegee 1 may be preferably a stainless steel coated with Teflon.

Referring to FIG. 2 through FIG. 4, description will be made about the operation of the first squeegee.

First, the slope of the first squeegee 7 is adjusted. For this purpose, the lockbelt 10 is loosened, and is set to a desired angle by rotating the angle-adjusting board 9 so as to tighten the lockbolt 10.

Subsequently, description will be made about the resin-sealing operation using the liquid resin referring in addition to FIG. 5.

In a step A, the air cylinder 8 is operated such that the first squeegee 7 is projected or protruded as indicated by a broken line. Further, it is confirmed whether or not the first squeegee 7 contacts with a sensor 7. When the first squeegee 7 contacts with the sensor 7, a pilot lamp lights up.

When the first squeegee 7 does not contact with the sensor 7, the pulse motor 17 illustrated in FIG. 3 rotates, and the squeegee supporting portion 15 performs an inching operation or a step feeding operation until the pilot lamp lights up.

When the height of the first squeegee 7 is determined, the height of the second squeegee 1 is inevitably determined. Specifically, the second squeegee 1 has a slightly higher height. Thus, the preparation of the first squeegee 7 is completed.

Figure 4A:
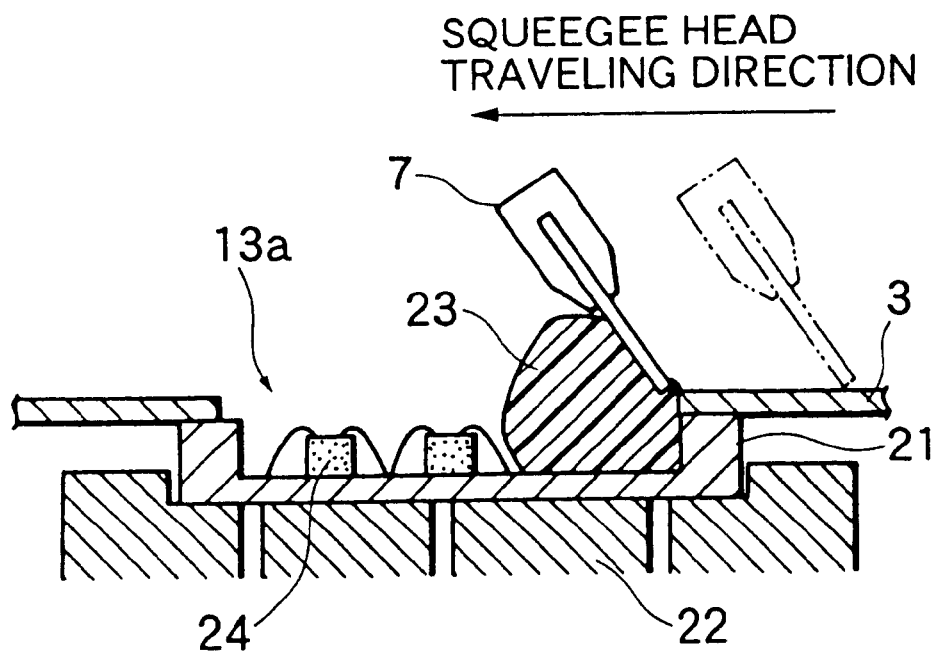
FIGS. 4A and 4B are diagrams for explaining an operation of a first squeegee.

Subsequently, in a step B of FIG. 5, the substrate 21 provided with a plurality of semiconductor devices 24 is positioned and arranged on the stand 22 in the condition where the squeegee guide 3 is disposed, as illustrated in FIG. 4A.

Further, the holes of the stand 22 is exhausted to vacuum, and the substrate 21 is adsorbed in vacuum.

Moreover, the squeegee guide plate 3 is mechanically fixed. The liquid resin 23 is dropped in a dispenser (not shown) in the opening portion 13 of the substrate 21 to build up the liquid resin 23.

Figure 4B:
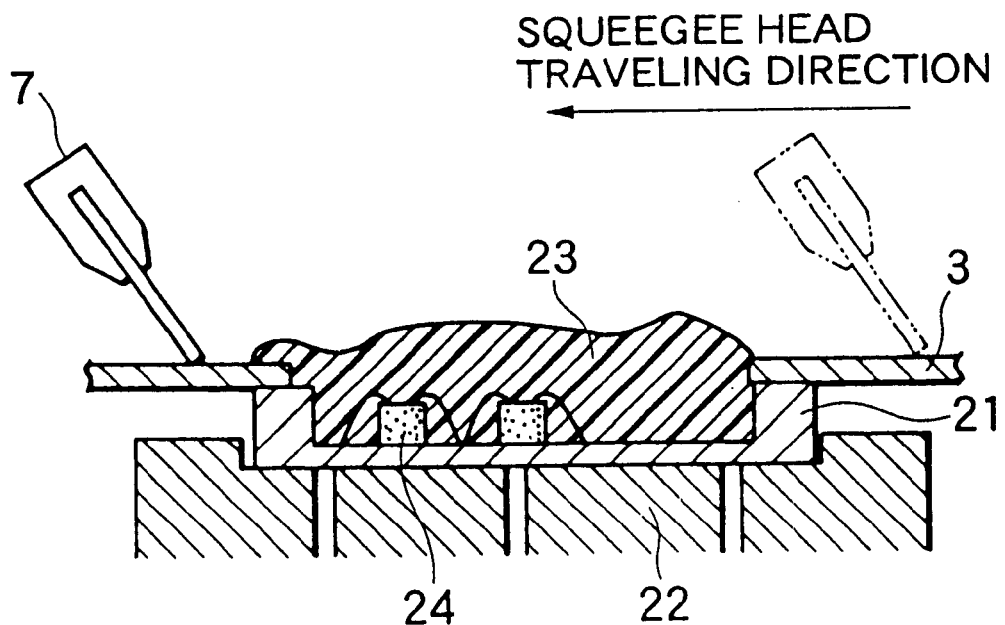

Successively, the squeegee head 20 is moved in the direction indicated by the arrow, as illustrated in FIG. 4B. Thereby, the first squeegee 7 rakes the liquid resin 23. Consequently, the liquid resin 23 is uniformly protuberated from the opening portion 13a of the squeegee guide plate 3, as illustrated in FIG. 4B.

However, the surface of the liquid resin 23 is in a slightly waving state, as shown in FIG. 4B. Subsequently, the squeegee heads 20 halts, and the air cylinder 8 illustrated in FIG. 2 is operated.

In consequence, the first squeegee 7 moves backward toward the position retreated from the opening portion 13a.

Figure 6A:
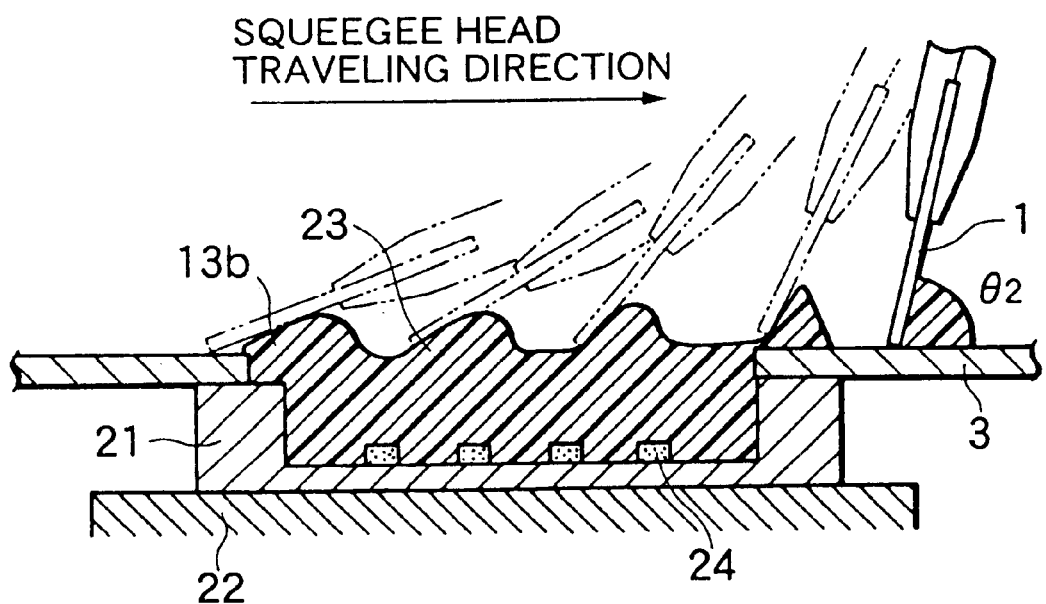
FIGS. 6A and 6B are diagrams for explaining an operation of a second squeegee.
Figure 6B:
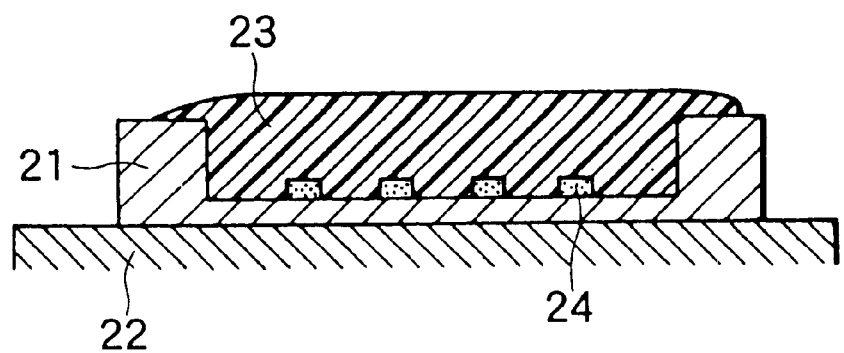

Referring to FIGS. 6A and 6B, description will be made about the operation of the second squeegee 1.

Figure 5:
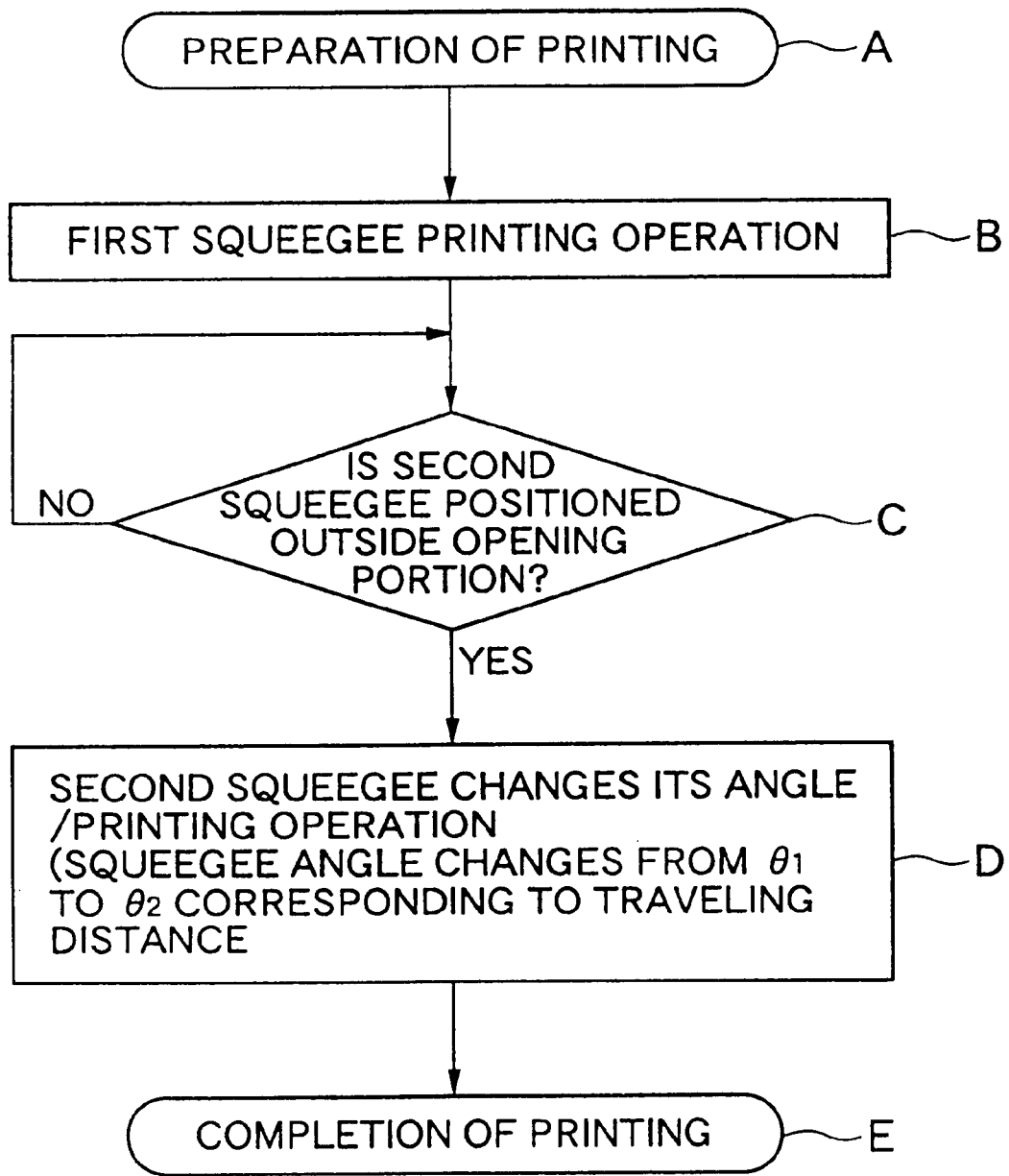
FIG. 5 is a flowchart for explaining a resin-sealing operation using a liquid resin.

In a step C of FIG. 5, a sensor (not shown) detects whether or not the position of the second squeegee 1 is positioned outside the opening portion 13b of the squeegee guide plate 3.

If the sensor detects the position, the pulse motor 17 illustrated in FIG. 3 automatically rotates, and the second squeegee 1 descends or moves downward.

Further, a piezo sensor (not shown) attached to a cutting edge portion of the end of the second squeegee 1 is operated, the cutting edge portion of the second squeegee 1 is contacted thereto. Moreover, the rotation of the pulse motor 17 halts in response to the signal.

In the meantime, if the second squeegee 1 is not positioned outside the opening edge 13b, the squeegee head 20 automatically travels, and stops at the predetermined position.

Subsequently, in a step D of FIG. 5, the motor 6 illustrated in FIG. 2 rotates with the travel of the squeegee head 20 indicated by arrow, as illustrated in FIG. 6A.

Further, the circular arc gear 4 of the turning mechanism rotates, and the second squeegee 1 turns in the circular arc form.

The slope of the second squeegee 1 is gradually increased from θ1 with its travel, and the second squeegee 1 reaches the other opening edge such that the slope becomes θ2.

Thus, the slope of the second squeegee 1 is increased with movement thereof. Thereby, the liquid resin 23 is slightly removed at the beginning of raking the squeegee guide plate 20, and the removed resin is sent backward.

Further, the liquid resin 23, which is protuberated at the rear opening end of the squeegee guide plate 3, is removed and is protuberated on the squeegee guide plate 3.

In a step E of FIG. 5, the squeegee guide plate 3 is removed or detached. If necessary, the resin attached on the frame of the substrate 21 may be removed by the use of a knife.

Thus, the surface of the liquid resin 23, in which the semiconductor device 24 is buried, becomes smooth or flat. Consequently, the wiring pattern is not exposed from the substrate 21, and a plurality of semiconductor devices 24 can be mounted or arranged.

Subsequently, the vacuum holes of the stand 22, which adsorbs and supports the substrate 21, is exhausted to air to remove the substrate 21, and is transferred to a processing unit (not shown) for curing the resin.

As described above, according to this invention, the liquid resin built-up inside substrate having the frame is raked by the use of the first squeegee.

Thereafter, the liquid resin, which is raked in the waving form on the surface, is raked again such that the tilt angle thereof is gradually increased by the use of the second squeegee. Thereby, the resin is sealed such that the surface of the liquid resin becomes smooth or flat.

In consequence, the wiring pattern is not exposed from the surface of the liquid resin, and a large number of semiconductor devices can be resin-sealed.

As a result, yield can be enhanced, the resin is not wasted, and the cost can be largely reduced.

Further, the squeegee head of the squeegee-supporting portion attached to the first squeegee and the second squeegee perform only a single round trip operation as the resin-sealing operation.

As a result, the resin-sealing operation is carried out at excessively short time, and the productivity can also be enhanced.

While this invention has thus far been disclosed in conjunction with an embodiment thereof, it will be readily possible for those skilled in the art to put this invention into practice in the various other manners.

What is claimed is:

1. An apparatus for sealing a resin using a liquid resin, comprising:
    a substrate which has a frame for surrounding the substrate and which is provided with a plurality of semiconductor devices and which has a first opening portion;
    a squeegee guide plate which is placed on the frame and which has a second opening portion, the second opening portion being larger than first opening portion in size;
    a first squeegee which moves along the squeegee guide plate in a first direction and which rakes the liquid resin, the liquid resin being protuberated in order to bury the semiconductor devices;
    a second squeegee which moves along the squeegee guide plate in a second direction opposite to the first direction and which further rakes the liquid resin so as to smooth a surface of the liquid resin; and
    a turning mechanism which serves to turn the second squeegee in a circular arc form during moving the second squeegee and which comprises:
        a squeegee head which is attached to the first squeegee and which has guide grooves of a circular arc form having a pair coaxial circles,
        a pair of fixing members which slide along the guide grooves and which fix the second squeegee,
        a linking member which links the fixing members to each other,
        a circular arc gear which is fixed to the fixing members, and
        a motor which rotates the gear.

2. An apparatus as claimed in claim 1, further comprising:
    a supporting portion which supports the first and second squeegees, and
    an up-down transferring mechanism which transfers the supporting portion upward and downward.

3. An apparatus as claimed in claim 1, further comprising:
    an air cylinder which transfers the first squeegee forward and backward.

4. An apparatus as claimed in claim 1, further comprising:
    an angle-adjusting board which adjusts a slope of the first squeegee.

5. A method of sealing a resin comprising using an apparatus for sealing a resin using a liquid resin, said apparatus comprises
    a substrate which has a frame for surrounding the substrate and which is provided with a plurality of semiconductor devices and which has a first opening portion;
    a squeegee guide plate which is placed on the frame and which has a second opening portion, the second opening portion being larger than first opening portion in size;
    a first squeegee which moves along the squeegee guide plate in a first direction and which rakes the liquid resin, the liquid resin being protuberated in order to bury the semiconductor devices;

a second squeegee which moves along the squeegee guide plate in a second direction opposite to the first direction and which further rakes the liquid resin so as to smooth a surface of the liquid resin; and a turning mechanism which serves to turn the second squeegee in a circular arc form during moving the second squeegee and which comprises:
- a squeegee head which is attached to the first squeegee and which has guide grooves of a circular arc form having a pair coaxial circles,
- a pair of fixing members which slide along the guide grooves and which fix the second squeegee,
- a linking member which links the fixing members to each other,
- a circular arc gear which is fixed to the fixing members, and
- a motor which rotates the gear, said method comprising the steps of:
- transferring the first squeegee in the first direction along the squeegee guide plate;
- dropping the liquid resin into the flame of the substrate so as to protuberate over the semiconductor devices;
- raking the protuberated liquid resin;
- transferring the second squeegee in the second direction along the squeegee guide plate; and
- raking the liquid resin again such that a tilt angle between a liquid resin surface and the second squeegee is gradually increased by the use of the turning mechanism as a slope of the second squeegee is gradually increased as the second squeegee travels from one opening edge to the other.

* * * * *